(12) United States Patent
Brown

(10) Patent No.: US 9,518,326 B2
(45) Date of Patent: Dec. 13, 2016

(54) METHOD FOR FORMING AN ELECTROSTATIC CHUCK USING FILM PRINTING TECHNOLOGY

(71) Applicant: Applied Materials, Inc., Santa Clara, CA (US)

(72) Inventor: Karl M. Brown, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 552 days.

(21) Appl. No.: 14/059,402

(22) Filed: Oct. 21, 2013

(65) Prior Publication Data

US 2015/0109715 A1    Apr. 23, 2015

(51) Int. Cl.
*C23C 28/00* (2006.01)
*H01L 21/683* (2006.01)
*H02N 13/00* (2006.01)

(52) U.S. Cl.
CPC ............ *C23C 28/32* (2013.01); *C23C 28/34* (2013.01); *H01L 21/6831* (2013.01); *H02N 13/00* (2013.01)

(58) Field of Classification Search
CPC ...... C23C 28/32; C23C 28/34; H01L 21/6831; H02N 13/00
See application file for complete search history.

(56) References Cited

U.S. PATENT DOCUMENTS

| 5,310,453 | A | * | 5/1994 | Fukasawa | ........... H01L 21/6833 438/716 |
|---|---|---|---|---|---|
| 6,267,839 | B1 | | 7/2001 | Shamouilian et al. | |
| 6,303,879 | B1 | | 10/2001 | Burkhart | |
| 6,501,636 | B1 | * | 12/2002 | Savas | ................. H01L 21/6831 361/234 |
| 6,731,496 | B2 | * | 5/2004 | Hiramatsu | ........ H01L 21/67103 219/444.1 |
| 6,924,464 | B2 | * | 8/2005 | Zhou | ..................... H05B 3/265 118/724 |

FOREIGN PATENT DOCUMENTS

| JP | 2012151450 A | 8/2012 |
|---|---|---|
| KP | 10-2011-0040508 A | 4/2011 |

OTHER PUBLICATIONS

PCT international search report and written opinion of PCT/US2014/058167 dated Jan. 9, 2015. The PCT Search resport is being used as the English translation for KR 10-2011-0040508.

* cited by examiner

*Primary Examiner* — Zeev V Kitov
(74) *Attorney, Agent, or Firm* — Patterson & Sheridan, LLP

(57) ABSTRACT

In one embodiment, a method for forming an electrostatic chuck includes forming vias in a ceramic plate and printing a metal paste in the vias and curing the ceramic plate. The method includes printing the metal paste on a front surface of the ceramic plate and curing the ceramic plate, and printing the metal paste on a bottom surface of the ceramic plate and curing the ceramic plate to form one or more contact pads. The method also includes printing a dielectric film on the front surface of the ceramic plate and curing the ceramic plate. The method may further include printing one or more heating elements on a bottom surface of the ceramic plate and curing the ceramic plate, printing the dielectric film on the bottom, and bonding the ceramic plate to a backing plate.

19 Claims, 5 Drawing Sheets

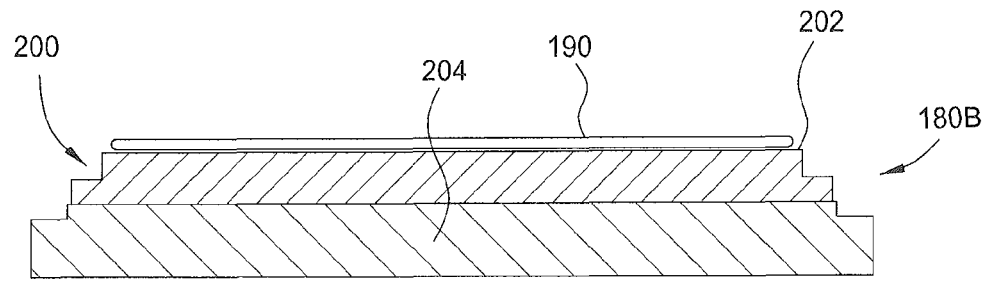
FIG. 2
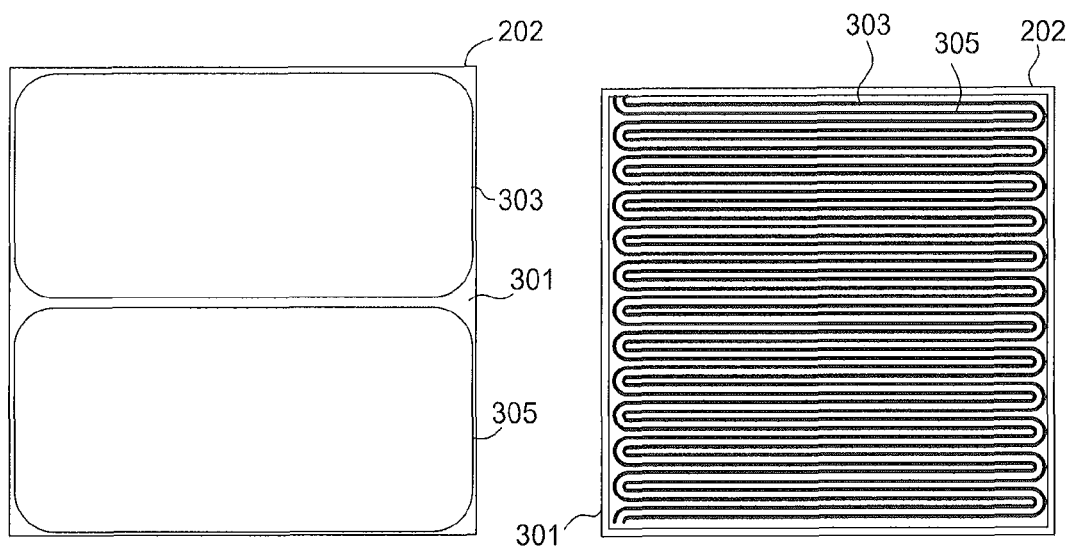
FIG. 4A
FIG. 4B
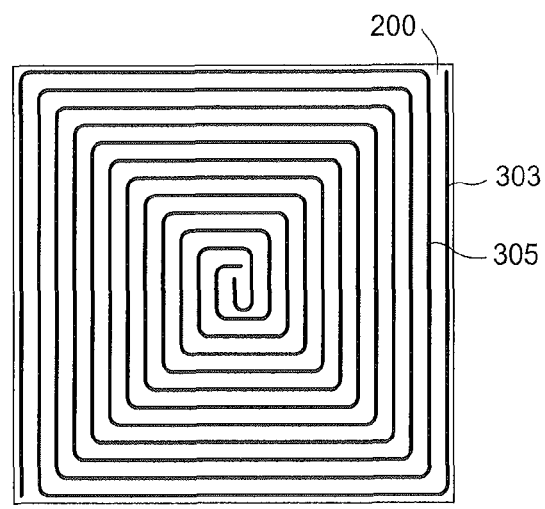
FIG. 4C

METHOD FOR FORMING AN ELECTROSTATIC CHUCK USING FILM PRINTING TECHNOLOGY

BACKGROUND OF THE DISCLOSURE

Field of the Invention

Embodiments of the invention generally relate to a method for forming an electrostatic chuck (ESC), and more particularly, for forming an ESC using film printing technology.

Description of the Background Art

In the processing of substrates, such as semiconductor wafers and displays, a substrate support is used to retain a substrate during a particular manufacturing process. The substrate support apparatus may include an electrostatic chuck (ESC) for attracting and retaining a substrate, such as a semiconductor wafer, during a manufacturing process such as in a physical vapor deposition (PVD) processing system, chemical vapor deposition (CVD) processing system and etching system. In substrate processing equipment, the electrostatic chuck may be detachably secured to a pedestal within the process chamber that is capable of raising and lowering the height of the ESC and substrate.

ESCs typically include one or more electrodes embedded within a unitary chuck body which comprises a dielectric or semi-conductive ceramic material across which an electrostatic clamping field can be generated. In a bipolar electrode chuck, the ESC comprises two electrodes which are electrically biased relative to one another to provide an electrostatic force that holds the substrate to the ESC. Often during the fabrication of ESCs, it is difficult to attach metal components (e.g., metal backing plates) to a ceramic chuck body or embed metal components (e.g., electrodes) within the ceramic chuck body via a furnace anneal process, due to the difference in thermal expansion coefficients (CTE) of the ceramic and metal. This may result in thermo-mechanical stresses that can cause the ceramic to fracture or chip during thermal cycling. Additionally, differences in the CTEs may increase with temperature resulting in greater thermo-mechanical stresses at higher temperatures. To compensate for these stresses, the ceramic chuck body may be made thicker to provide greater strength and prevent fracture, but this often adds cost to the chuck body and increases manufacturing time. Therefore, there is a need for an improved method for forming an ESC.

SUMMARY OF THE INVENTION

Embodiments described herein generally relate to a method for forming an electrostatic chuck (ESC) using film printing technology.

In one embodiment, a method for forming an ESC includes forming vias in a ceramic plate and printing a metal paste in the vias and curing the ceramic plate. The method includes printing the metal paste on a front surface of the ceramic plate and curing the ceramic plate. The method also includes printing the metal paste on a bottom surface of the ceramic plate and curing the ceramic plate to form one or more contact pads on the bottom surface of the ceramic plate. The method includes printing a dielectric film on the front surface of the ceramic plate and curing the ceramic plate.

In another embodiment, a method for forming an ESC includes forming vias in a ceramic plate and printing a silver paste in the vias and curing the ceramic plate. The method includes printing the silver paste on a front surface of the ceramic plate and curing the ceramic plate. The method also includes printing the silver paste on a bottom surface of the ceramic plate and curing the ceramic plate to form one or more contact pads and one or more heating elements on a bottom surface of the ceramic plate. The method includes printing a dielectric film on the front surface of the ceramic plate and curing the ceramic plate and bonding the ceramic plate to a backing plate by using a reactive nano metal bond. The reactive nano metal bond is a resistive element sandwiched within a low temperature melting material on both sides. The low temperature material melts at about 100 degrees Celsius or less.

In yet another embodiment, an ESC comprises a ceramic plate having vias formed therethrough. The vias are filled with silver. The ESC also includes one or more silver layers on a front surface of the ceramic plate forming one or more electrodes and one or more silver layers on a back surface of the ceramic plate forming one or more contact pads. The contact pads are coupled to the electrodes by the vias. The ESC also includes a metal backing plate bonded to the ceramic plate with a reactive nano metal bond, which does not require a thermal annealing process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 illustrates an enlarged cross-sectional view of an electrostatic chuck according to one embodiment of the invention.

FIGS. 4A-4C illustrate a top view of the electrostatic chuck of FIG. 3B according to several embodiments of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the present invention. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

Figure 1:
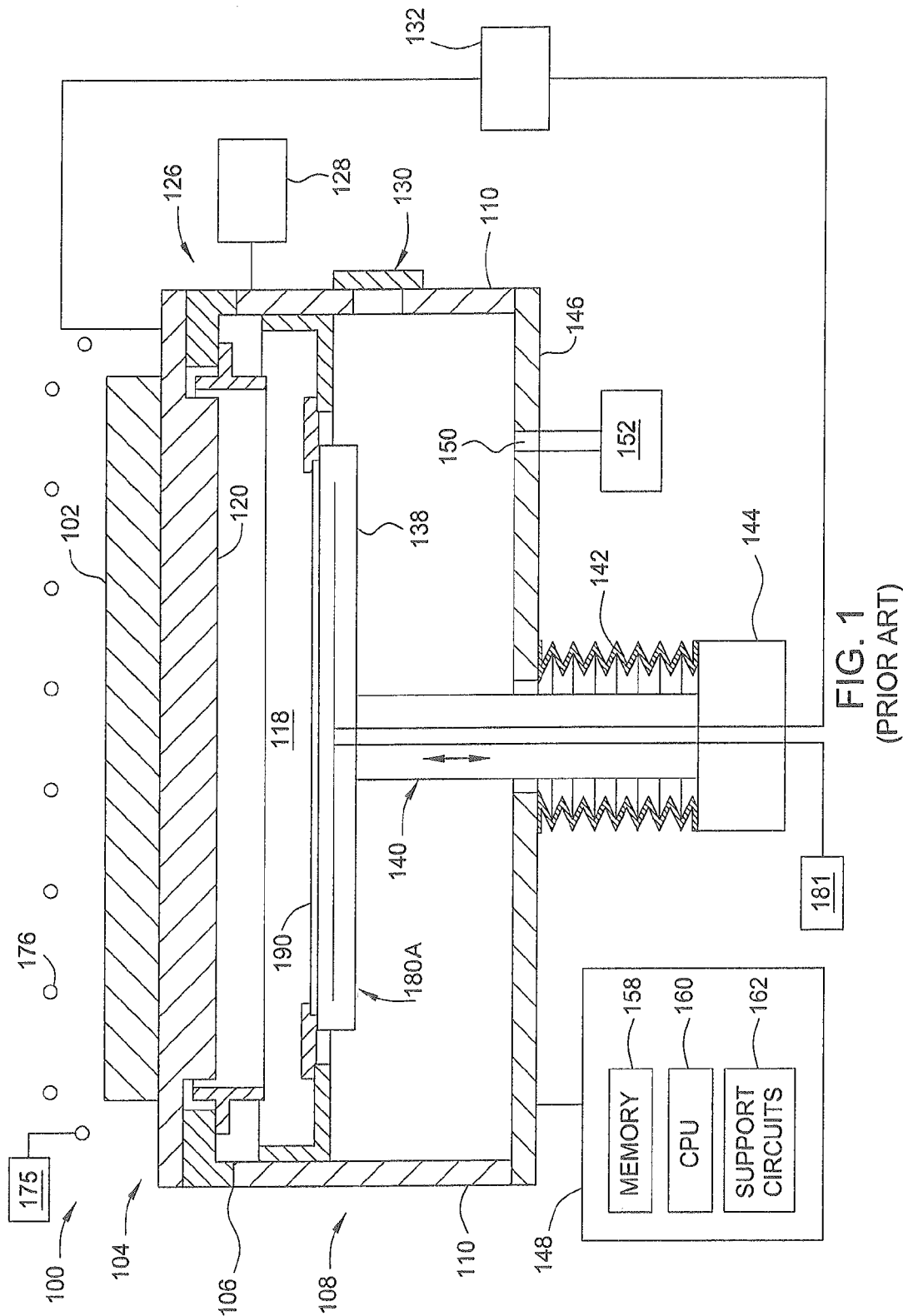
FIG. 1 (Prior Art) is a schematic view of a process chamber that would benefit from an embodiment of the invention.
Figure 3A:
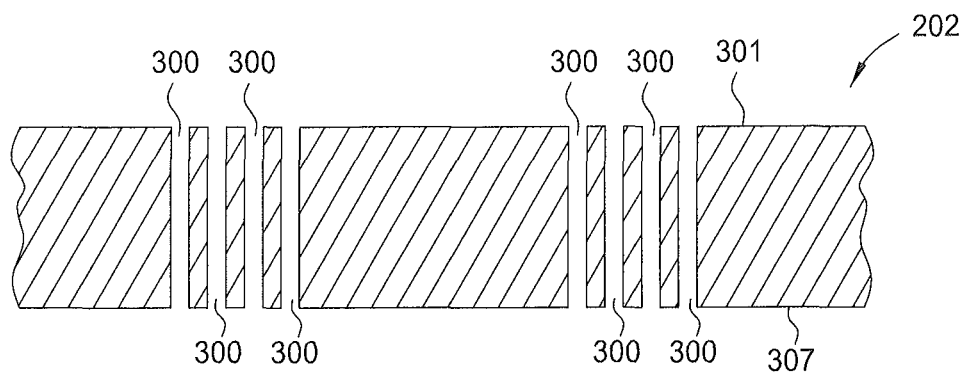
FIGS. 3A-3E illustrate an enlarged cross-sectional view of the electrostatic chuck of FIG. 2 according to one embodiment of the invention.
Figure 3B:
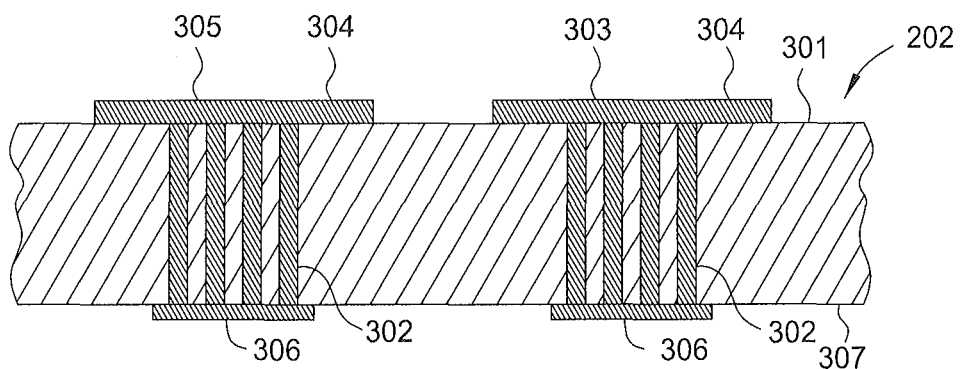
Figure 3C:
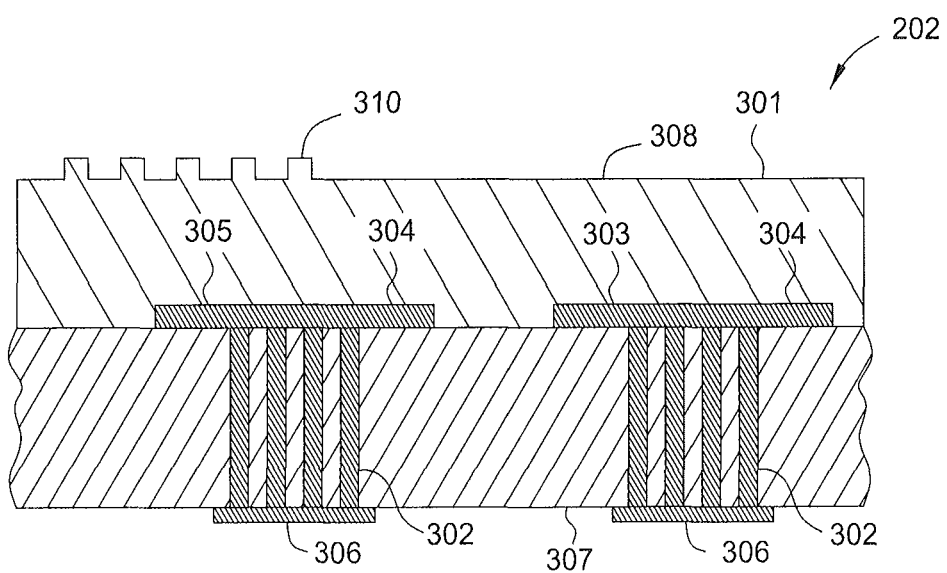
Figure 3D:
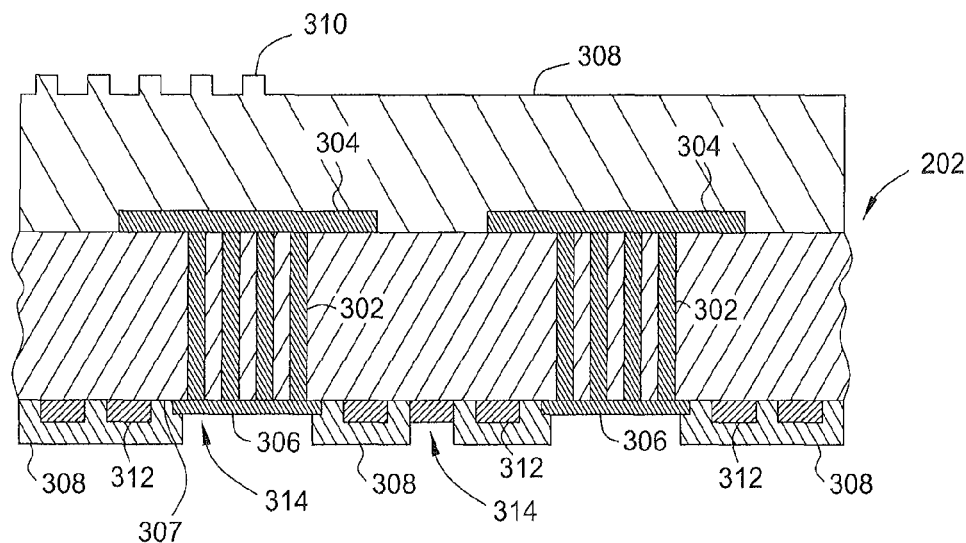
Figure 3E:
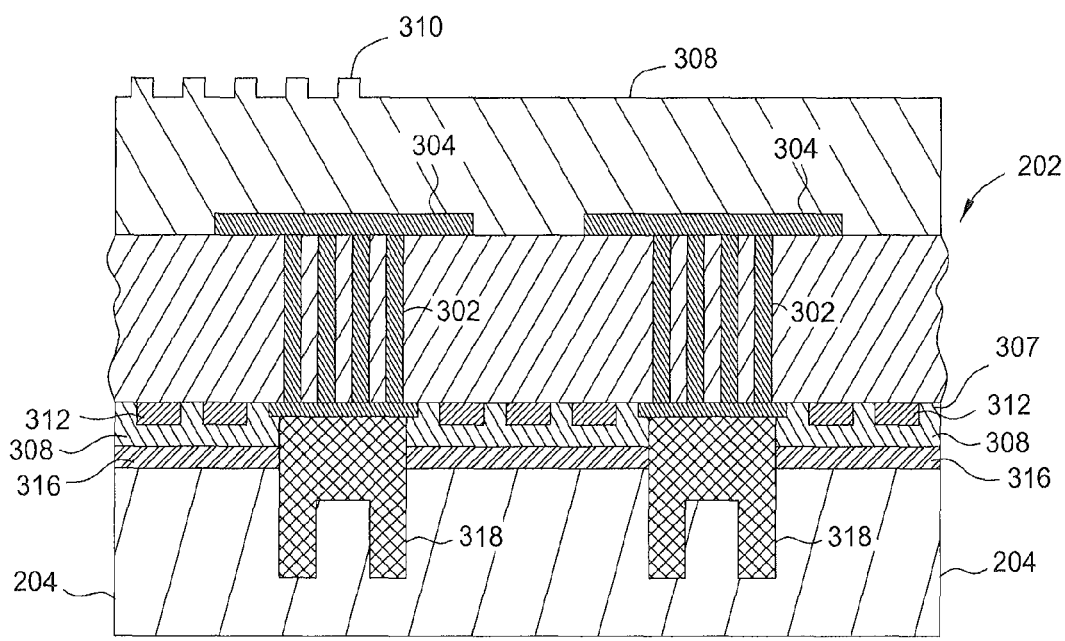

FIG. 1 (Prior Art) illustrates a conventional physical vapor deposition (PVD) process chamber 100 (e.g., a sputter process chamber) suitable for housing an electrostatic chuck (ESC) 180B (see FIG. 2) formed according to one embodiment disclosed herein. The process chamber 100 includes a chamber body 108 having a processing volume 118 defined therein. The chamber body 108 has sidewalls 110 and a bottom 146. The dimensions of the chamber body 108 and related components of the process chamber 100 are not limited and are generally proportionally larger than the size of a substrate 190 to be processed. Any suitable substrate size may be processed. Examples of suitable substrate sizes include substrates with a 200 mm diameter or 300 mm diameter or 450 mm diameter.

A chamber lid assembly 104 is mounted on the top of the chamber body 108. The chamber body 108 may be fabricated from aluminum or other suitable materials. A substrate access port 130 is formed through the sidewall 110 of the chamber body 108, facilitating the transfer of the substrate 190 into and out of the process chamber 100. The access port 130 may be coupled to a transfer chamber and/or other chambers of a substrate processing system.

A gas source 128 is coupled to the chamber body 108 to supply process gases into the processing volume 118. A pumping port 150 is formed through the bottom 146 of the chamber body 108. A pumping device 152 is coupled to the processing volume 118 to evacuate and control the pressure therein.

The lid assembly 104 generally includes a target 120 and a ground shield assembly 126 coupled thereto. The target 120 provides a material source that can be sputtered and deposited onto the surface of the substrate 190 during a PVD process. The target 120 serves as the cathode of the plasma circuit during DC sputtering. A high voltage power supply, such as a power source 132, is connected to the target 120 to facilitate sputtering materials from the target 120. A substrate support 138 is disposed below the target 120 and configured to support the substrate 190.

The lid assembly 104 may further comprise a full face erosion magnetron cathode 102 mounted above the target 120 which enhances efficient sputtering materials from the target 120 during processing.

A shaft 140 extending through the bottom 146 of the chamber body 108 couples to a lift mechanism 144. The lift mechanism 144 is configured to move the substrate support 138 between a lower transfer position and an upper processing position. Bellows 142 circumscribe the shaft 140 and are coupled to the substrate support 138 to provide a flexible seal there between, thereby maintaining vacuum integrity of the chamber processing volume 118.

The substrate support 138 provides the (ESC) 180A. In one embodiment, the ESC 180A is a detachable ESC, detachable from the shaft 140. The ESC 180A may be found in the ENDURA® platform from Applied Materials, Inc., of Santa Clara, Calif. The ESC 180A uses the attraction of opposite charges to hold both insulating and conducting substrates 190 for PVD processes and is powered by a DC power supply 181. The ESC 180A comprises an electrode embedded within a dielectric body. In one embodiment, the ESC is a bi-polar ESC or has multiple electrodes embedded therein. The DC power supply 181 may provide a DC chucking voltage of about 200 volts to about 2,000 volts to the electrode. The DC power supply 181 may also include a system controller for controlling the operation of the electrode by directing a DC current to the electrode for chucking and de-chucking the substrate 190.

The ESC 180A performs in the temperature range required by the thermal budget of the device integration requirements formed by the substrate 190. For example, the temperature range for: (i) a detachable ESC 180A (DTESC) is about minus 25 degrees Celsius to about 100 degrees; (ii) a mid-temperature ESC 180A (MTESC) is about 100 degrees Celsius to about 200 degrees Celsius; (iii) a high temperature or high temperature biasable or high temperature high uniformity ESC 180A (HTESC or HTBESC or HTHUESC) is about 200 degrees Celsius to about 500 degrees Celsius, to ensure fast and uniform heating of the substrate 190. Additionally, any of the ESCs may be used without being heated, i.e., at room temperature. Details of a new method of forming an ESC 180B will be discussed further below in reference to FIGS. 2, 3A-3E, 4A-4C and 5A-5B.

An antenna 176, such as one or more inductor coils, may be provided adjacent the process chamber 100. An antenna power supply 175 may power the antenna 176 to inductively couple energy, such as RF energy, to the process gas to form plasma in a process zone in the process chamber 100.

A controller 148 is coupled to the process chamber 100. The controller 148 includes a central processing unit (CPU) 160, a memory 158, and support circuits 162. The controller 148 is utilized to control the process sequence, regulating the gas flows from the gas source 128 into the process chamber 100 and controlling ion bombardment of the target 120. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 148 that controls the process chamber 100 such that the processes are performed in accordance with the present invention. The software routines may also be stored and/or executed by a second controller (not shown) that is located remotely from the process chamber 100.

FIG. 2 illustrates an enlarged cross-sectional view of the ESC 180B according to one embodiment of the invention. The ESC 180B includes: (i) a puck 200 having a ceramic plate 202 configured to support and contact the substrate 190, and (ii) a backing plate 204. In one embodiment, the ceramic plate 202 comprises aluminum oxide ($Al_2O_3$). In another embodiment, the ceramic plate 202 has a thickness of between about 0.5 mm to about 2.0 mm, for example, between about 1 mm to about 1.5 mm. In one embodiment, the backing plate 204 comprises aluminum or titanium. In another embodiment, the backing plate 204 has a thickness of between about 15 mm to about 25 mm, for example, about 20 mm. While not shown, the backing plate 204 may include one or more cooling channels.

Figure 5A:
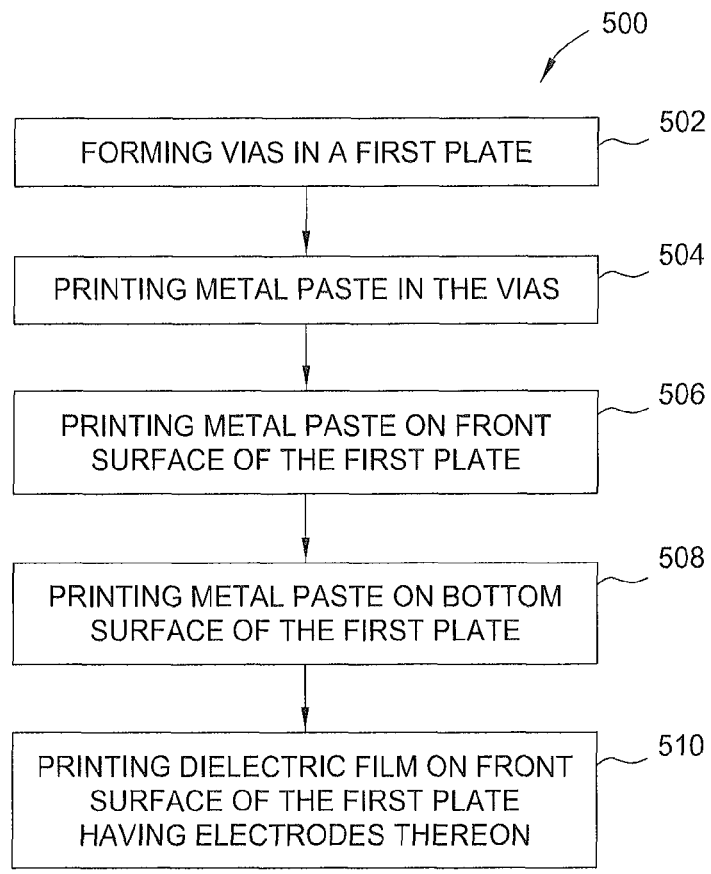
FIGS. 5A-5B illustrate a process sequence for fabricating an electrostatic chuck according to one embodiment of the invention.

FIGS. 3A-3E illustrate an enlarged cross-sectional view of the ESC 180B according to one embodiment, and FIG. 5A illustrates one embodiment of a process sequence 500 for fabricating the ESC 180B using film printing. Referring to FIGS. 2, 3A-3E and 5A-5B, the process sequence 500 begins at block 502 by forming vias 300 into the ceramic plate 202. In one embodiment, the vias 300 extend from a front surface 301 to a bottom surface 307 in the ceramic plate 202 by laser drilling or any other suitable method for forming vias in the ceramic plate 202. In one embodiment, the vias 300 are about 10 mils to about 15 mils in diameter.

At block 504, a metal paste 302 is printed into the vias 300 and cured. In one embodiment, the printing may be any suitable printing method, for example, screen printing. In one embodiment, the ceramic plate 202 is fired in a furnace or annealing chamber at about 850 degrees Celsius to cure the metal paste 302. The metal is selected from a group comprising silver (Ag) or silver-based metals, palladium (Pd) or palladium alloys, combinations thereof, or any other metals suitable for forming electrodes. At block 506 a metal paste 304 is printed onto the front surface 301 of the ceramic plate 202. The ceramic plate 202 is fired in a furnace or annealing chamber at about 850 degrees Celsius to cure the metal paste 304. In one embodiment, the metal 304 may be etched away to form at least two patterned (metal) electrodes 303, 305, having opposing charges, on the front surface 301 of the ceramic plate 202.

Referring to FIGS. 2 and 4A-4C, in several embodiments, the ESC 180B is a bi-polar ESC having the two electrodes 303, 305 which are electrically biased relative to one another to provide an electrostatic force that holds the substrate 190 to the ESC 180B. In one embodiment, as shown in FIG. 4A, the electrodes 303, 305 form a "Double O" pattern on the front surface 301 of the ceramic plate 202. The two electrodes 303,305 are spaced about 2 mm apart from each other. The two electrodes 303, 305 form a square on the front surface 301 of the ceramic plate 202 having a length of about 100 mm and a width of about 100 mm.

In another embodiment, as shown in FIG. 4B, the electrodes 303, 305 forms an intgerdigiated or "finger pattern," wherein each finger is about 1 mm apart. The finger pattern electrodes 303, 305 form a square on the front surface 301 of the ceramic plate 202 having a length of about 100 mm and a width of about 100 mm.

In another embodiment, as shown in FIG. 4C, the electrodes 303, 305 form a spiral pattern. The spiral pattern of the electrodes 303, 305 forms a square on the front surface 301 of the ceramic plate 202 having a length of about 100 mm and a width of about 100 mm. The electrode patterns in FIGS. 4A-4C advantageously provide positive and negative electrodes 303, 305 that are symmetrical and have identical square areas. Therefore, the above configurations provide a more stable and uniform electrostatic clamping field for the substrate 190 disposed thereon.

Referring back to FIGS. 5A and 3B-3E, at block 508 a metal paste 306 is printed onto the bottom surface 307 of the ceramic plate 202. The ceramic plate 202 is fired in a furnace or annealing chamber at about 850 degrees Celsius to cure the metal paste 306 to form a metal contact pad. In one embodiment, the metal contact pad 306 is about 10 mm wide. In another embodiment, the metal contact pad 306 is a high voltage pad configured to apply voltage to the positive or negative electrodes 303, 305. As discussed above, the DC power supply 181 may provide a DC chucking voltage of about 200 volts to about 2,000 volts to the electrodes 303, 305.

At block 510 a dielectric film 308 is printed on the front surface 301 of the ceramic plate 202 having the electrodes 303, 305 thereon, to form the puck 200. In one embodiment, the dielectric film 308 has a thickness of about 95 μm to about 105 μm, for example, about 100 μm. In one embodiment, the ceramic plate 202 is fired in a furnace or annealing chamber at about 850 degrees Celsius to cure the dielectric film 310. In one embodiment, the dielectric film is glass. Additionally, the dielectric film 308 may be printed to include dielectric bumps 310. The dielectric bumps 310 advantageously provide a minimum contact area on the front surface 301 of the ceramic plate 202 to minimize influence on the process, thermal, mechanical and electrical characteristics of substrate 190 due to direct contact between substrate 190 and the electrostatic chuck 180B during processing. In one embodiment, the bumps 310 cover less than about 5% to about 15% of a front surface of the puck 200, for example, about 10%.

Process wise, the dielectric bumps 310 minimize the backside particles of a substrate that may lead to defects on other substrates disposed below, e.g., when the substrates are stacked in a front opening unified pod. In the absence of the dielectric bumps 310, particles on the front surface 301 of the ceramic plate (due to direct contact with the substrate 190) would scratch the substrate 190 or generate unwanted backside particles, that could potentially lead to substrate 190 breakage in subsequent processing.

Thermally, the dielectric bumps 310 buffer potential non-uniform heat transfer to the substrate 190 that may lead to substrate 190 breakage or ESC 180B cracking, depending on the temperature of the processing.

Mechanically, the dielectric bumps 310 provide controlled and uniform chucking force due to the height of the dielectric bumps, i.e, the space between ESC 180B and the substrate 190. In the absence of the dielectric bumps 310, the chucking force could potentially be very sensitive to ESC surface conditions, such as small particles or a worn surface, that creates a huge variation on the chucking force. Additionally, the added height from the dielectric bumps 310 prolongs the life of the ESC 180B, making the ESC 180B less susceptible to direct contact with the substrate 190. This advantageously prevents abrasion of the ESC 180B.

Figure 5B:
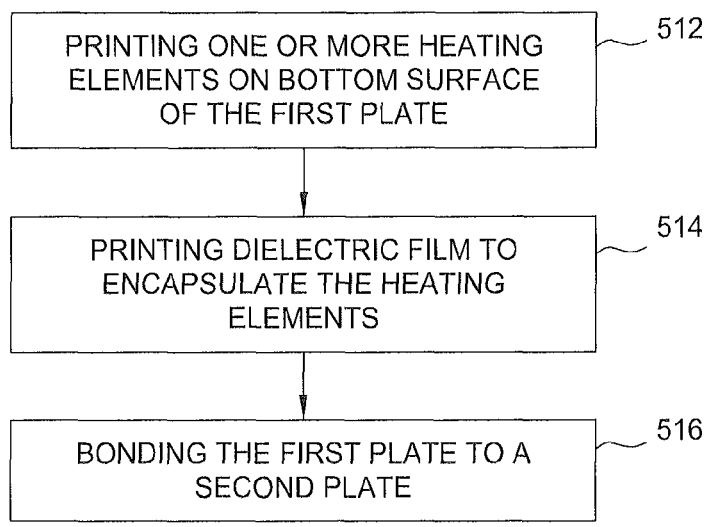

FIG. 5B represents optional steps for the process sequence 500 for fabricating the ESC 180B. At optional block 512 one or more heating elements 312 are printed on the backside 307 of the ceramic plate 202. In one embodiment, the ceramic plate 202 is fired in a furnace or annealing chamber at about 850 degrees Celsius to cure the heating elements 312. The heating elements 312 may be spaced apart to evenly distribute heat within the ESC 180B or in any other suitable pattern for heating the ESC 180B. Advantageously, the heating elements 312 can quickly heat the ESC 180B to about 120 degrees Celsius or even higher, to about 250 degrees Celsius. In one embodiment, at optional block 514 the dielectric film 308 is printed on the bottom surface 307 of the ceramic plate 202 to encapsulate the heating elements 312. In one embodiment, the dielectric 308 film is printed to leave windows 314 in the bottom surface of the ceramic plate 202 to access the contact pads 306 and/or the heating elements 312.

Advantageously, the film printing in blocks 502-514 allows the ESC 180B to be formed quickly with flexibility of the electrodes 303, 305 and heating elements 312 design. It is contemplated that other elements, e.g., sensors or filters, may be printed to integrate with the electrodes 303, 305 and heating elements 312.

At optional block 516, the ceramic plate 202 is bonded to the backing plate 204 by a reactive nano metal bond 316. In one embodiment, the backing plate 204 is a metal backing plate. The metal backing plate 204 may include one or more terminals 318 with mulit-Lam inserts coupled to the contact pads 206. The terminals 318 are coupled to the DC power supply 181 and may provide a DC chucking voltage of about 200 volts to about 2,000 volts to the electrodes 303, 305. The metal bond 316 has a plurality of holes configured to mate with the windows 314 accessing the contact pads 306 and/or heating elements (not shown in FIG. 3E). In one embodiment, the metal bond 316 includes a resistive element sandwiched between a low temperature melting material, e.g., indium glue. The ceramic plate 202 is bonded to the metal backing plate 204 by providing a high current to the resistive element to heat and melt the melting material. The resistive element requires only a small amount of localized heat, e.g., less than about 100 degrees Celsius, to heat and melt the melting material and consequentially bond the metal backing plate 204 to the ceramic plate 202. Advantageously, due to the low melting temperature of the melting material, the ceramic plate 202 and the metal backing plate 204 experience minimal to little thermal expansion. The minimal thermal expansion prevents bowing or cracking of the ESC 180B, and therefore extends the lifetime of the ESC 180B.

While the foregoing is directed to embodiments of the present invention, other and further embodiments of the invention may be devised without departing from the basic scope thereof, and the scope thereof is determined by the claims that follow.

The invention claimed is:

1. A method for fabricating an electrostatic chuck comprising:
    forming vias in a ceramic plate;
    printing a metal paste in the vias and curing the ceramic plate;
    printing the metal paste on a front surface of the ceramic plate and curing the ceramic plate;
    printing the metal paste on a bottom surface of the ceramic plate and curing the ceramic plate to form one or more contact pads on the bottom surface of the ceramic plate, wherein the metal paste on the front surface and the metal paste on the bottom surface are electrically coupled by the metal paste in the vias; and
    printing a dielectric film on the front surface of the ceramic plate and curing the ceramic plate.

2. The method of claim 1, wherein the printing the metal paste on the bottom surface of the ceramic plate further comprises:
    printing one or more heating elements on a bottom surface of the ceramic plate and curing the ceramic plate.

3. The method of claim 2, further comprising:
    printing the dielectric film on the bottom surface of the ceramic plate and curing the ceramic plate to encapsulate the one or more heating elements.

4. The method of claim 1, wherein the printing the metal paste on the front surface forms at least two electrodes on the front surface of the ceramic plate.

5. The method of claim 4, wherein the at least two electrodes form a Double O pattern, an interdigitated pattern, or a spiral pattern.

6. A method for fabricating an electrostatic chuck comprising:
    forming vias in a ceramic plate;
    printing a metal paste in the vias and curing the ceramic plate;
    printing the metal paste on a front surface of the ceramic plate and curing the ceramic plate;
    printing the metal paste on a bottom surface of the ceramic plate and curing the ceramic plate to form one or more contact pads on the bottom surface of the ceramic plate; and
    printing a dielectric film on the front surface of the ceramic plate and curing the ceramic plate, wherein the printing the dielectric film comprises printing dielectric bumps on the front surface of the ceramic plate.

7. The method of claim 1, wherein the metal paste comprises silver or palladium and the dielectric film comprises glass.

8. A method for fabricating an electrostatic chuck comprising:
    forming vias in a ceramic plate;
    printing a silver paste in the vias and curing the ceramic plate;
    printing the silver paste on a front surface of the ceramic plate and curing the ceramic plate;
    printing the silver paste on a bottom surface of the ceramic plate and curing the ceramic plate to form one or more contact pads and one or more heating elements on a bottom surface of the ceramic plate;
    printing a dielectric film on the front surface of the ceramic plate and curing the ceramic plate;
    bonding the ceramic plate to a backing plate by using a reactive nano metal bond, wherein the metal bond is a resistive element sandwiched within a low temperature melting material on both sides, wherein the low temperature material melts at about 100 degrees Celsius or less.

9. The method of claim 8, wherein the low temperature material is indium.

10. The method of claim 8, wherein bonding the ceramic plate to the backing plate does not include a thermal annealing process.

11. The method of claim 8, wherein the backing plate comprises a metal.

12. The method of claim 11, wherein the ceramic plate comprises aluminum oxide ($Al_2O_3$) and the backing plate comprises aluminum or titanium.

13. The method of claim 8, wherein the curing is performed in a thermal annealing chamber at about 850 degrees Celsius.

14. The method of claim 8, wherein the ceramic plate has a thickness of between about 1 mm to about 1.5 mm.

15. The method of claim 8, wherein the dielectric film comprises glass.

16. The method of claim 15, wherein the glass dielectric film has a thickness of between about 95 µm to about 105 µm.

17. The method of claim 8, wherein the silver paste on the front surface of the ceramic plate form electrodes and the one or more contact pads are configured to provide voltage to the electrodes.

18. The method of claim 17, wherein the metal backing plate comprises one or more terminal configured to supply voltage to the contact pads.

19. An electrostatic chuck comprising:
    a ceramic plate comprising:
        vias formed therethrough, wherein the vias are filled with silver;
        one or more silver layers on a front surface of the ceramic plate forming one or more electrodes; and
        one or more silver layers on a back surface of the ceramic plate forming one or more contact pads, wherein the one or more contact pads are coupled to the electrodes by the vias; and
    a metal backing plate bonded to the ceramic plate with a reactive nano metal bond, without a thermal annealing process.

* * * * *